United States Patent
Sung et al.

(10) Patent No.: US 11,224,122 B2
(45) Date of Patent: Jan. 11, 2022

(54) ELECTRONIC DEVICE INCLUDING SHIELD CAN STRUCTURE

(71) Applicant: Samsung Electronics Co., Ltd., Gyeonggi-do (KR)

(72) Inventors: Euisuck Sung, Gyeonggi-do (KR); Meekyeong Nam, Gyeonggi-do (KR); Cholhee Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/987,606

(22) Filed: Aug. 7, 2020

(65) Prior Publication Data

US 2021/0045226 A1 Feb. 11, 2021

(30) Foreign Application Priority Data

Aug. 7, 2019 (KR) .................. 10-2019-0096178

(51) Int. Cl.
*H05K 9/00* (2006.01)
*H05K 1/02* (2006.01)
*H01Q 1/24* (2006.01)

(52) U.S. Cl.
CPC ........... *H05K 1/023* (2013.01); *H05K 9/0022* (2013.01); *H05K 9/0024* (2013.01); *H05K 9/0052* (2013.01); *H01Q 1/243* (2013.01)

(58) Field of Classification Search
CPC ..... H05K 9/0022; H05K 9/0024–0052; H05K 1/02
See application file for complete search history.

(56) References Cited

U.S. PATENT DOCUMENTS

| | | | |
|---|---|---|---|
| 6,930,891 B1 | 8/2005 | Hama et al. | |
| 7,351,107 B1* | 4/2008 | Burlock | H05K 3/308 439/607.37 |
| 2004/0256128 A1* | 12/2004 | King | H05K 9/0033 174/382 |
| 2011/0155445 A1* | 6/2011 | Kwon | H05K 9/0037 174/384 |

(Continued)

FOREIGN PATENT DOCUMENTS

| | | |
|---|---|---|
| JP | 2001-085884 | 3/2011 |
| JP | 2013-235961 | 11/2013 |

(Continued)

OTHER PUBLICATIONS

International Search Report dated Oct. 7, 2020 issued in counterpart application No. PCT/KR2020/008713, 7 pages.

*Primary Examiner* — Hoa C Nguyen
(74) *Attorney, Agent, or Firm* — The Farrell Law Firm, P.C.

(57) ABSTRACT

An electronic device and shield can structure are provided. The electronic device includes a housing, a circuit board disposed in the housing and one or more electronic components mounted on the circuit board, a shield can coupled to the circuit board and covering the one or more electronic components, one or more first fastening structures disposed on the circuit board and coupled to the shield can, the one or more first fastening structures having a first width, and one or more second fastening structures extending from the one or more first fastening structures, the one or more second fastening structures having a second width smaller than the first width.

16 Claims, 17 Drawing Sheets

(56) References Cited

U.S. PATENT DOCUMENTS

| | | | |
|---|---|---|---|
| 2012/0281386 A1* | 11/2012 | Kim | H05K 9/0032 |
| | | | 361/818 |
| 2013/0148318 A1 | 6/2013 | Kim | |
| 2014/0160822 A1* | 6/2014 | Kuwano | H05K 7/20945 |
| | | | 363/141 |
| 2016/0150685 A1* | 5/2016 | Kurita | H05K 9/0024 |
| | | | 174/384 |
| 2017/0280565 A1 | 9/2017 | Tso | |

FOREIGN PATENT DOCUMENTS

| | | |
|---|---|---|
| JP | 2013-251491 | 12/2013 |
| KR | 1020120082750 | 7/2012 |
| KR | 1020140064160 | 5/2014 |
| KR | 1020150113725 | 10/2015 |

\* cited by examiner

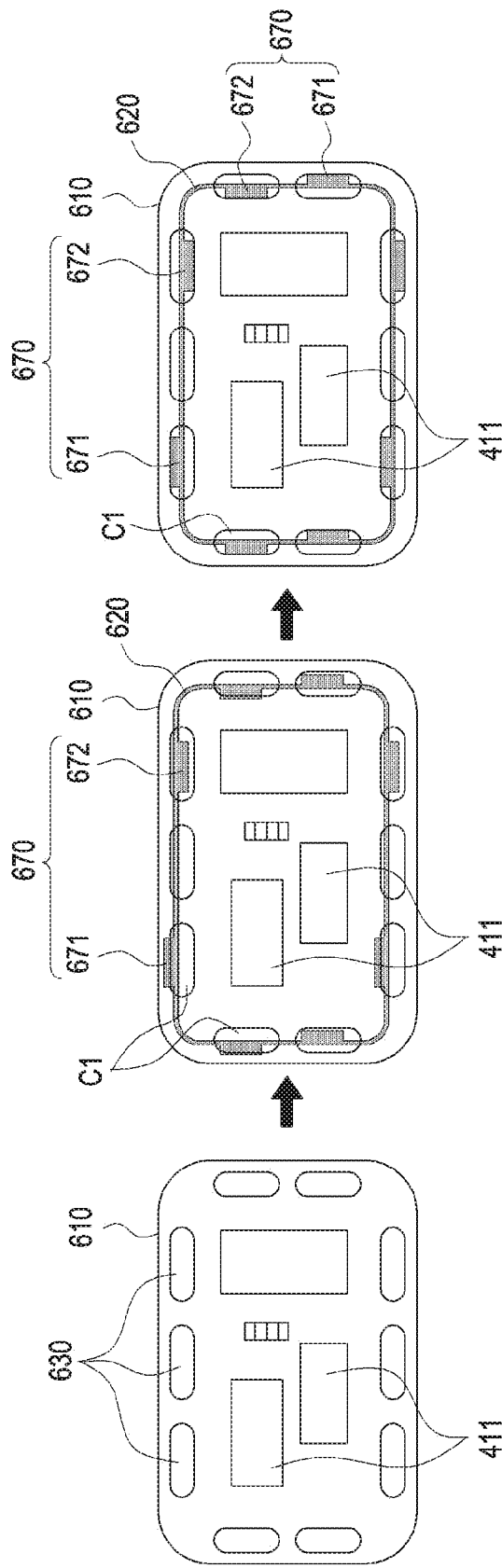

ELECTRONIC DEVICE INCLUDING SHIELD CAN STRUCTURE

CROSS-REFERENCE TO RELATED APPLICATION(S)

This application is based on and claims priority under 35 U.S.C. 119 to Korean Patent Application Serial No. 10-2019-0096178, filed on Aug. 7, 2019, in the Korean Intellectual Property Office, the entire disclosure of which is incorporated herein by reference.

BACKGROUND

1. Field

The present disclosure relates generally to an electronic device with a shield can structure, which includes one or more fastening structures for accurately mounting a shield can on a printed circuit board.

2. Description of Related Art

As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as video games, a multimedia function, such as replaying music/videos, a communication and security function for mobile banking, and a scheduling or e-wallet function.

An electronic device may include various electronic components for running various functions. For example, electronic elements or circuit lines may be mounted on a printed circuit board (PCB), and at least some of them may be electrically connected. The electronic components may cause electromagnetic waves. Generally, electromagnetic waves may be useful in some cases (e.g., for radio communication or satellite communication purposes) but, in other cases, may negatively affect the operation of electronic devices. One example of such negative influence is electromagnetic interference (EMI). The EMI generated from each electronic component may be harmful for the human body and may cause noise to vulnerable devices. Thus, upon mounting an electronic component on a printed circuit board, the electronic component may be covered with an EMI shield can.

When coupled to a PCB, a shield can may be misaligned or displaced on the printed circuit board. The misalignment or displacement of the shield can may cause a coupling deviation in the coupling area of the printed circuit board, resulting in failure to precisely mount on the printed circuit board. The shield can may come in contact with its surrounding electronic components on the printed circuit board, causing interference with the electronic components. Thus, the electronic components may malfunction.

SUMMARY

The present disclosure has been made to address at least the disadvantages described above and to provide at least the advantages described below.

In accordance with an aspect of the present disclosure, an electronic device is provided. The electronic device includes a housing, a circuit board disposed in the housing and one or more electronic components mounted on the circuit board, a shield can coupled to the circuit board and covering the one or more electronic components, one or more first fastening structures disposed on the circuit board and coupled to the shield can, the one or more first fastening structures having a first width, and one or more second fastening structures extending from the one or more first fastening structures, the one or more second fastening structures having a second width smaller than the first width.

In accordance with an aspect of the present disclosure, an electronic device is provided. The electronic device includes a housing, a circuit board disposed in the housing and one or more electronic components mounted on the circuit board, a shield can coupled to the circuit board and covering the one or more electronic components, and one or more first fastening structures disposed on the circuit board and coupled to the shield can, the one or more first fastening structures having a first width. The shield can includes one or more coupling portions coupled to the one or more first fastening structures.

In accordance with an aspect of the present disclosure, a shield can structure is provided. The shield can structure includes a circuit board on which one or more electronic components are mounted, a shield can coupled to the circuit board and covering the one or more electronic components, one or more first fastening structures disposed on the circuit board and coupled to the shield can, the one or more first fastening structures having a first width and one or more second fastening structures extending from the one or more first fastening structures, the one or more second fastening structures having a second width smaller than the first width.

In accordance with an aspect of the present disclosure, a shield can structure is provided. The shield can structure includes a circuit board on which one or more electronic components mounted, a shield can coupled to the circuit board and covering the one or more electronic components, and one or more first fastening structures disposed on the circuit board and coupled to the shield can, the one or more first fastening structures having a first width. The shield can includes one or more coupling portions coupled to the one or more first fastening structures.

BRIEF DESCRIPTION OF THE DRAWINGS

The above and other aspects, features and advantages of certain embodiments of the disclosure will be more apparent from the following detailed description taken in conjunction with the accompanying drawings, in which:

FIGS. 20A, 20B, and 20C are plan views of a process of coupling a shield can structure included in an electronic device, according to an embodiment.

DETAILED DESCRIPTION

Figure 1:
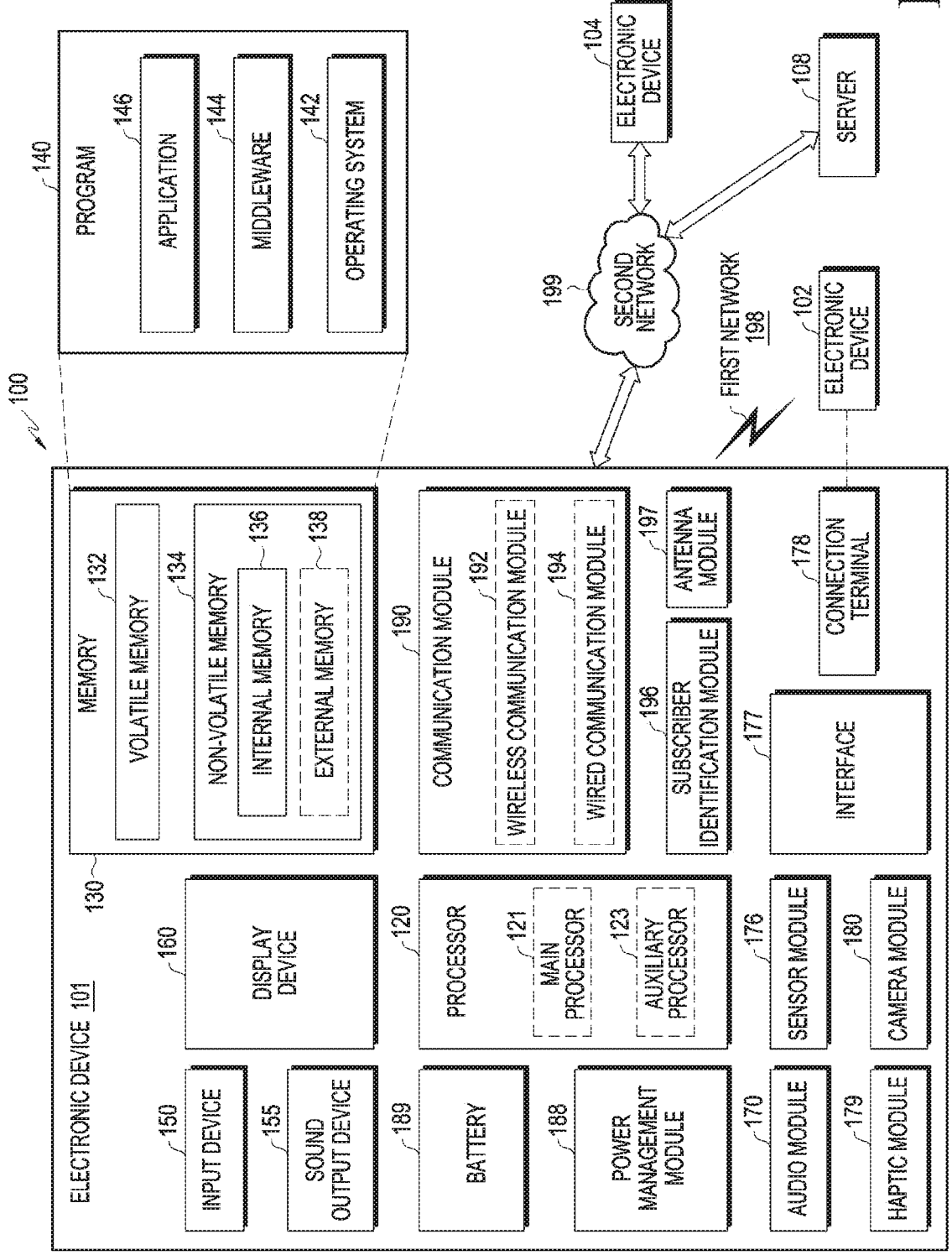
FIG. 1 is a block diagram illustrating an electronic device in a network environment according to an embodiment.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the present disclosure. In the description of the drawings, similar reference numerals are used for similar elements.

The terms "have," "may have," "include," and "may include" as used herein indicate the presence of corresponding features (for example, elements such as numerical values, functions, operations, or parts), and do not preclude the presence of additional features.

The expression "configured to (or set to)" as used herein may be used interchangeably with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context. For example, "a processor configured to (set to) perform A, B, and C" may mean a dedicated processor (e.g., an embedded processor) for performing a corresponding operation, or a generic-purpose processor (e.g., a central processing unit (CPU) or an application processor (AP)) capable of performing a corresponding operation by executing one or more software programs stored in a memory device.

The terms used in describing the various embodiments of the disclosure are for the purpose of describing particular embodiments and are not intended to limit the disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. Terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the disclosure.

An electronic device according to the disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

The electronic device may be a home appliance. The home appliance may include at least one of, for example, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

The electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, security devices, an automotive head unit, a robot for home or industry, an automatic teller machine (ATM) in banks, point of sales (POS) devices in a shop, or an Internet of things (IoT) device (e.g., a light bulb, various sensors, electric or gas meter, a sprinkler device, a fire alarm, a thermostat, a streetlamp, a toaster, a sporting goods, a hot water tank, a heater, a boiler, etc.).

The electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device may be a combination of one or more of the aforementioned various devices. The electronic device may also be a flexible device. Further, the electronic device is not limited to the aforementioned devices, and may include an electronic device according to the development of new technology.

Hereinafter, an electronic device will be described with reference to the accompanying drawings. In the disclosure, the term "user" indicates a person using an electronic device or a device (e.g., an artificial intelligence electronic device) using an electronic device.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, e.g., software (e.g., a program 140) to control at least one other component (e.g., a hardware or software component) of the electronic device 101 connected with the processor 120 and may process or compute various data. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a CPU or an AP), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain a sound through the input device 150 or output a sound through the sound output device 155 or an external electronic device (e.g., an electronic device 102 (e.g., a speaker or a headphone) directly or wirelessly connected with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or wireless communication channel between the electronic device 101 and an external electronic device (e.g., the electronic device 102, the electronic device 104, or the server 108) and performing communication through the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include one antenna including a radiator formed of a conductor or conductive pattern formed on a substrate (e.g., a PCB). According to an embodiment, the antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The first and second external electronic devices 102 and 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic device is not limited to the above-listed embodiments.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
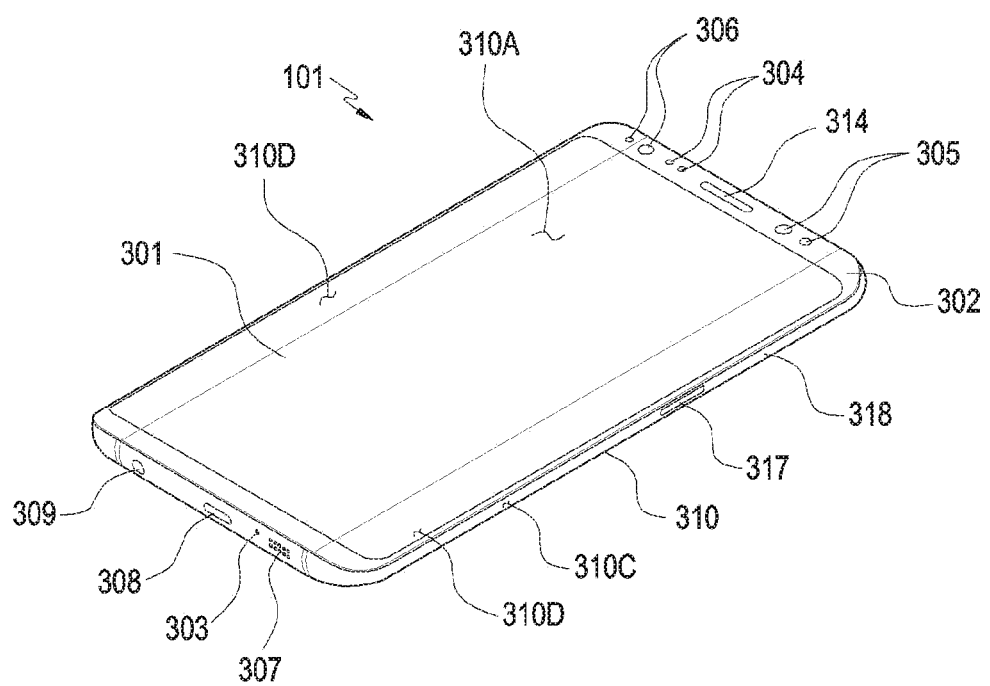
FIG. 2 is a front perspective view of an electronic device, according to an embodiment.
Figure 3:
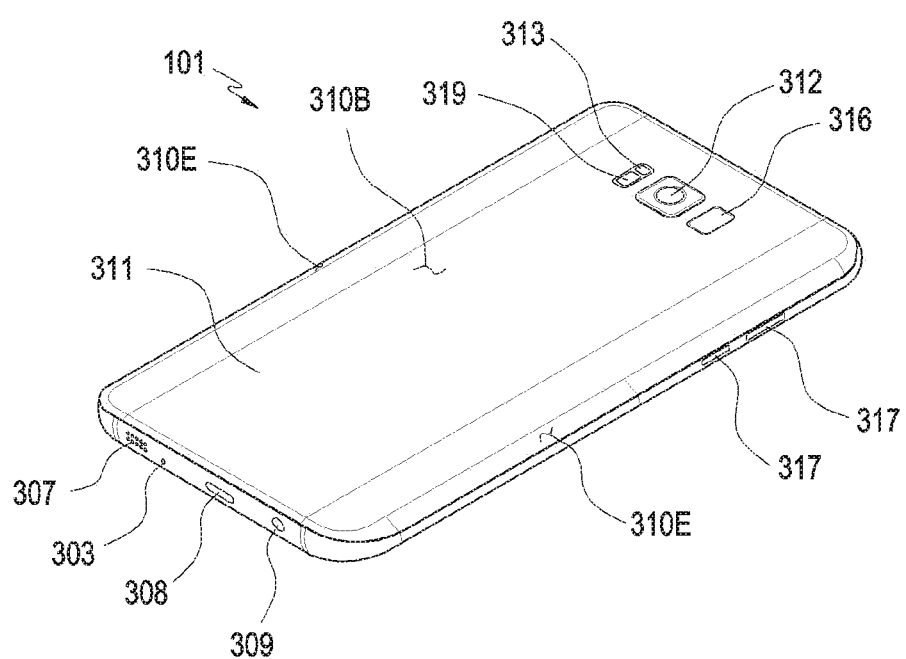
FIG. 3 is a rear perspective view of an electronic device, according to an embodiment.

FIG. 2 is a front perspective view of an electronic device 101, according to an embodiment. FIG. 3 is a rear perspective view of an electronic device 101, according to an embodiment.

Referring to FIGS. 2 and 3, an electronic device 101 may include a housing 310 including a first (or front) surface 310A, a second (or back) surface 310B, and a side surface 310C surrounding a space between the first surface 310A and the second surface 310B. The housing 310 may denote a structure forming the first surface 310A, the second surface 310B, and some of the side surfaces 310C of FIG. 2. At least part of the first surface 310A may have a substantially transparent front plate 302 (e.g., a glass plate or polymer plate including various coat layers). The second surface 310B may be formed of a substantially opaque rear plate 311. The rear plate 311 may be formed of, e.g., laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. The rear plate 311 and the side bezel plate 318 may be integrally formed together and include the same material (e.g., a metal, such as aluminum).

The front plate 302 may include two first regions 310D, which seamlessly and bendingly extend from the first surface 310A to the rear plate 311, on both the long edges of the front plate 302. The rear plate 311 may include second regions 310E, which seamlessly and bendingly extend from the second surface 310B to the front plate, on both the long edges. The front plate 302 (or the rear plate 311) may include only one of the first regions 310 (or the second regions 310E). Alternatively, the first regions 310D or the second regions 301E may partially be excluded. At a side view of the electronic device 101, the side bezel structure 318 may have a first thickness (or width) for sides that do not have the first regions 310D or the second regions 310E and a second thickness, which is smaller than the first thickness, for sides that have the first regions 310D or the second regions 310E.

The electronic device 101 may include at least one or more of a display 301, audio modules 303, 307, and 314, sensor modules 304, 316, and 319, camera modules 305, 312, and 313, key input devices 317, a light emitting device 306, and connector holes 308 and 309. The electronic device 101 may exclude at least one (e.g., the key input device 400 or the light emitting device 306) of the components or may add other components.

The display 301 may be exposed through the top of the front plate 302. At least a portion of the display 301 may be exposed through the front plate 302 forming the first surface 310A and the first regions 310D of the side surface 310C. The edge of the display 301 may be formed to be substantially the same in shape as an adjacent outer edge of the front plate 302. The interval between the outer edge of the display 301 and the outer edge of the front plate 302 may remain substantially even to give a larger area of exposure the display 301.

The screen display region of the display 301 may have a recess or opening in a portion thereof, and at least one or more of the audio module 314, sensor module 304, camera module 305, and light emitting device 306 may be aligned with the recess or opening. At least one or more of the audio module 314, sensor module 304, camera module 305, fingerprint sensor 316, and light emitting device 306 may be included on the rear surface of the screen display region of the display 301. The display 301 may be disposed to be coupled with, or adjacent, a touch detecting circuit, a pressure sensor capable of measuring the strength (pressure) of touches, and/or a digitizer for detecting a magnetic field-type stylus pen. At least part of the sensor modules 304 and 319 and/or at least part of the key input device 400 may be disposed in the first regions 310D and/or the second regions 310E.

The audio modules 303, 307, and 314 may include a microphone hole 303 and speaker holes 307 and 314. The microphone hole 303 may have a microphone inside to obtain external sounds. There may be a plurality of microphones to be able to detect the direction of a sound. The speaker holes 307 and 314 may include an external speaker hole 307 and a phone receiver hole 314. The speaker holes 307 and 314 and the microphone hole 303 may be implemented as a single hole, or speakers may be rested without the speaker holes 307 and 314 (e.g., piezo speakers).

The sensor modules 304, 316, and 319 may generate an electrical signal or data value corresponding to an internal operating state or external environmental state of the electronic device 101. The sensor modules 304, 316, and 319 may include a first sensor module 304 (e.g., a proximity sensor) and/or a second sensor module (e.g., a fingerprint sensor) disposed on the first surface 310A of the housing 310 and/or a third sensor module 319 (e.g., a heart-rate monitor (HRM) sensor) and/or a fourth sensor module 316 (e.g., a fingerprint sensor) disposed on the second surface 310B of the housing 310. The fingerprint sensor may be disposed on the second surface 310B as well as on the first surface 310A (e.g., the display 301) of the housing 310. The electronic device 101 may further include sensor modules (e.g., at least one of a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, or an illuminance sensor 304).

The camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an ISP. The flash 313 may include a light emitting diode (LED) or a xenon lamp. Two or more lenses (an IR camera, a wide-angle lens, and a telescopic lens) and image sensors may be disposed on one surface of the electronic device 101.

The light emitting device 306 may be disposed on the first surface 310A of the housing 310. The light emitting device 306 may provide information about the state of the electronic device 101 in the form of light. The light emitting device 306 may provide a light source that interacts with the camera module 305. The light emitting device 306 may include an LED, an IR LED, or a xenon lamp.

The connector holes 308 and 309 may include a first connector hole 308 for receiving a connector (e.g., a USB connector) for transmitting or receiving power and/or data to/from an external electronic device and/or a second connector hole 309 (e.g., an earphone jack) for receiving a connector for transmitting or receiving audio signals to/from the external electronic device.

Figure 4:
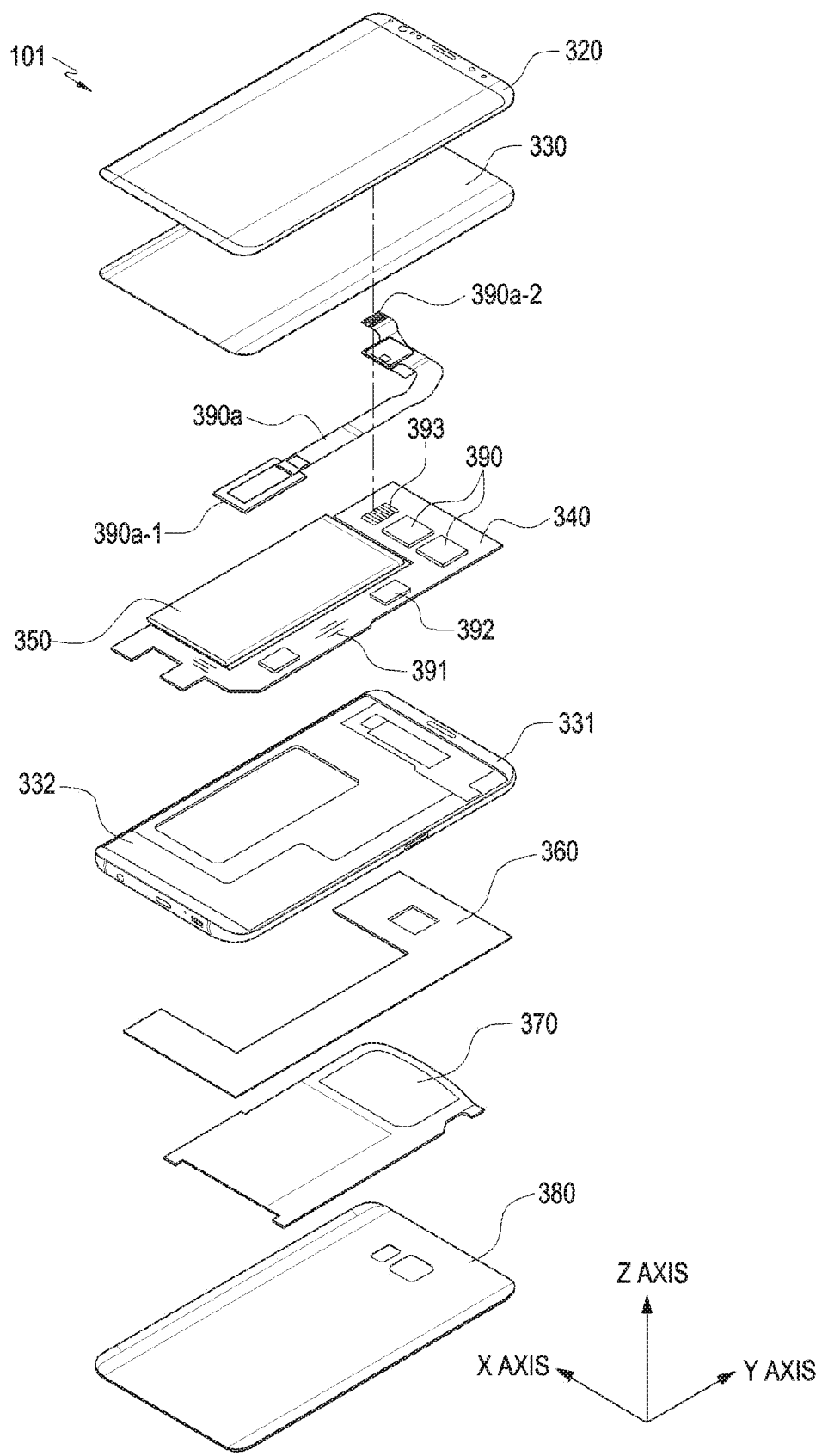
FIG. 4 is an exploded perspective view of an electronic device, according to an embodiment.

FIG. 4 is an exploded perspective view of an electronic device 101, according to an embodiment.

Referring to FIG. 4, an electronic device 101 may include a side bezel structure 331, a first supporting member 332 (e.g., a bracket), a front plate 320, a display 330, PCB 340, a battery 350, a second supporting member 360 (e.g., a rear case), an antenna 370, and a rear plate 380. The electronic device 101 may exclude at least one (e.g., the first supporting member 332 or the second supporting member 360) of the components or may add other components. At least one of the components of the electronic device 101 may be the same or similar to at least one of the components of the electronic device 101 of FIG. 2 or 3 and no duplicate description is made below.

The first supporting member 332 may be disposed inside the electronic device 101 to be connected with the side bezel structure 331 or integrated with the side bezel structure 331. The first supporting member 332 may be formed of a metal and/or non-metallic material (e.g., polymer). The display 330 may be joined onto one surface of the first supporting member 332, and the printed circuit board 340 may be joined onto the opposite surface of the first supporting member 311. A processor, memory, and/or interface may be mounted on the printed circuit board 340. The processor may include one or more of, e.g., a CPU, an AP, a GPU, an ISP, a sensor hub processor, or a CP.

The memory may include a volatile or non-volatile memory.

The interface may include an HDMI, a USB interface, an SD card interface, and/or an audio interface. The interface may electrically or physically connect the electronic device 101 with an external electronic device and may include a USB connector, an SD card/multimedia card (MMC) connector, or an audio connector.

The battery 350 may be a device for supplying power to at least one component of the electronic device 101. The battery 189 may include a primary cell which is not rechargeable, a secondary cell which is rechargeable, or a fuel cell. At least a portion of the battery 350 may be disposed on substantially the same plane as the printed circuit board 340. The battery 350 may be integrated or detachably disposed inside the electronic device 101.

The antenna 370 may be disposed between the rear plate 380 and the battery 350. The antenna 370 may include a near-field communication (NFC) antenna, a wireless charging antenna, and/or a magnetic secure transmission (MST) antenna. The antenna 370 may perform short-range communication with an external device or may wirelessly transmit or receive power necessary for charging. An antenna structure may be formed by a portion or combination of the side bezel structure 331 and/or the first supporting member 332.

The electronic device may include a plurality of communication devices 390. Some of the plurality of communication devices 390 may be implemented to transmit or receive radio waves with different characteristics (referred to as radio waves of frequency bands A and B) to implement MIMO. Some of the plurality of communication devices 390 may be configured to simultaneously transmit or receive radio waves with the same characteristic (referred to as radio waves of frequencies A1 and A2 in frequency band A) to implement diversity. Some of the plurality of communication devices 390 may be configured to simultaneously transmit or receive radio waves with the same characteristic (referred to as radio waves of frequencies B1 and B2 in frequency band B) to implement diversity. Two communication devices may be included. Alternatively, the electronic device 101 may include four communication devices to implement both MIMO and diversity. The electronic device 101 may include only one communication device 390.

Given the transmission and reception characteristics of radio waves, when one communication device is disposed in a first position of the printed circuit board 340, another communication device may be disposed in a second position, which is separated from the first position, of the printed circuit board 340. One communication device and another communication device may be disposed considering the distance therebetween depending on diversity characteristics.

At least one communication device 390 may include a wireless communication circuit to process radio waves transmitted or received in an ultra-high frequency band (e.g., 6 GHz or more and 300 GHz or less). The radiating conductor(s) of the at least one communication device 390 may be formed of a dipole-structure radiating conductor extending in one direction or a patch-type radiating conductor and a plurality of radiating conductors may be arrayed to form an antenna array. A chip (e.g., an integrated circuit (IC) chip) in which part of the wireless communication circuit is implemented may be disposed on the opposite surface of the surface where the radiating conductors are disposed or on one side of the area where the radiating conductors are disposed and may be electrically connected with the radiating conductor(s) via lines which are formed of a printed circuit pattern.

Figure 5:
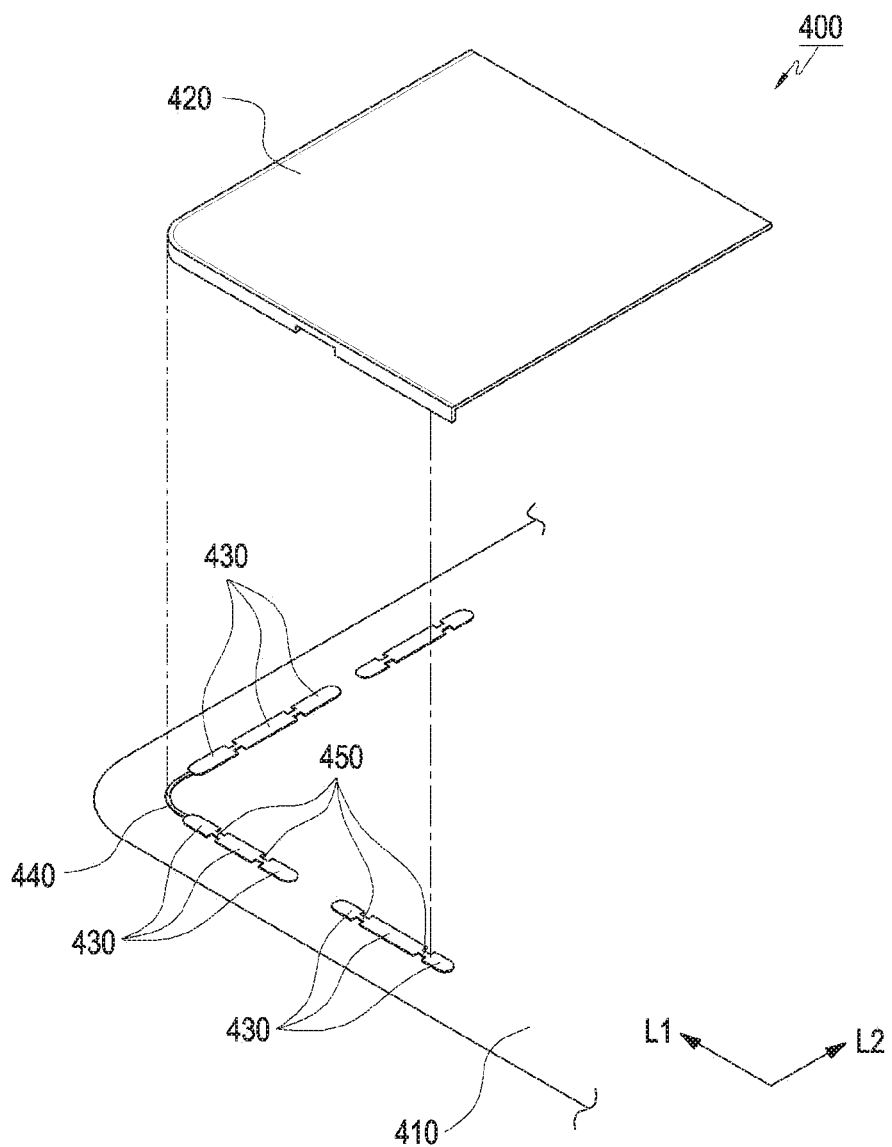
FIG. 5 is an exploded perspective view of a configuration of a shield can structure included in an electronic device, according to an embodiment.
Figure 6:
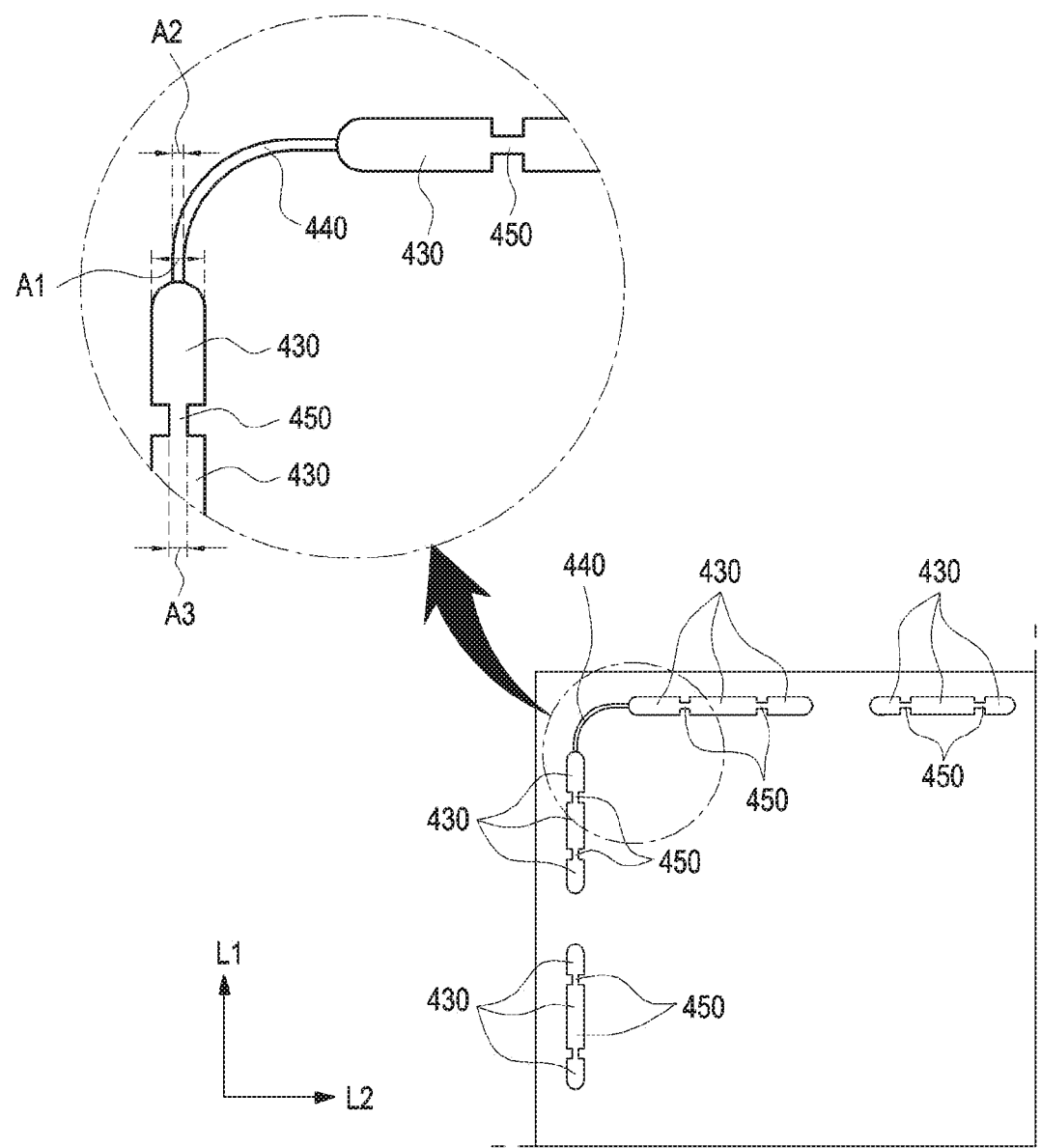
FIG. 6 is a plan view of one or more first, second, and third fastening structures formed on a circuit board in a configuration of a shield can structure included in an electronic device, according to an embodiment.
Figure 7:
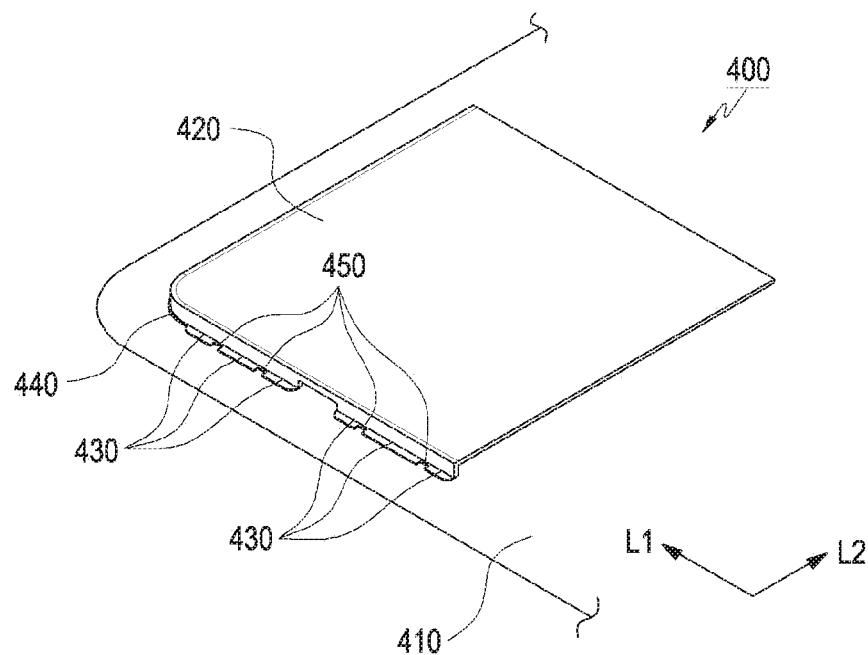
FIG. 7 is a perspective view of a coupled state of a shield can structure included in an electronic device, according to an embodiment.
Figure 8:
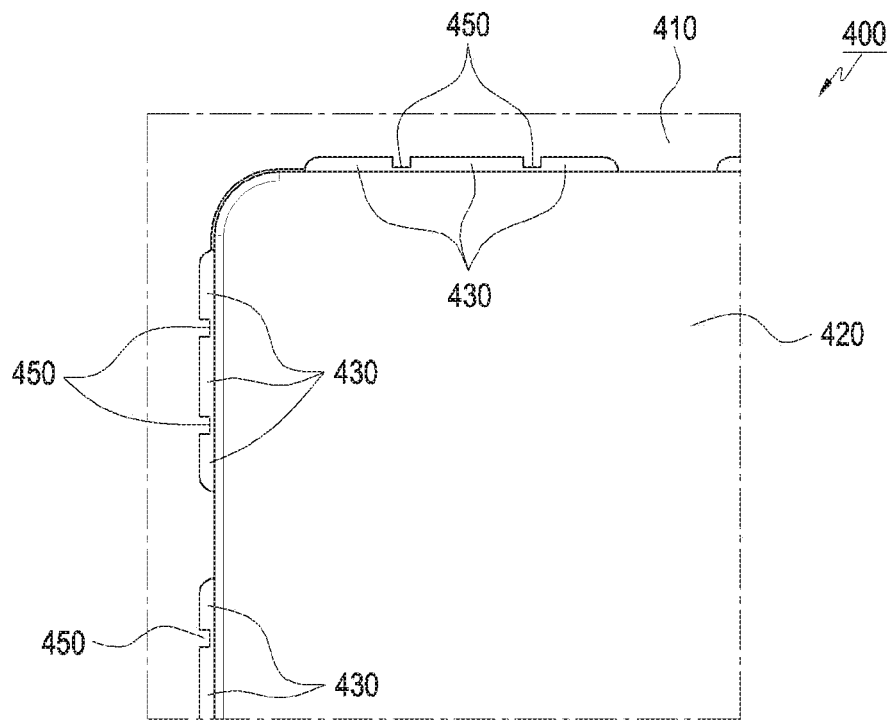
FIG. 8 is a plan view of a coupled state of a shield can structure included in an electronic device, according to an embodiment.

FIG. 5 is an exploded perspective view of a configuration of a shield can structure 400 included in an electronic device 101, according to an embodiment. FIG. 6 is a plan view of one or more first, second, and/or third fastening structures 430, 440, and 450 formed on a circuit board 410 in a configuration of a shield can structure 400 included in an electronic device 101, according to an embodiment. FIG. 7 is a perspective view of a coupled state of a shield can structure 400 included in an electronic device 101, according to an embodiment. FIG. 8 is a plan view of a coupled state of a shield can structure 400 included in an electronic device 101, according to an embodiment.

Referring to FIGS. 5 to 8, a shield can structure 400 included in an electronic device 101 may include a housing 310, a circuit board 410 on which one or more electronic components 411 are mounted, a shield can 420, and one or more first, second, and/or third fastening structures 430, 440, and 450. The circuit board 410 may be disposed in the housing 310 of the electronic device 101. The shield can 420 may be coupled to the circuit board 410 and, to shield EMI caused from the one or more electronic components 411, the shield can 420 may cover the one or more electronic components 411.

The shield can 420 may include at least one of a conductive material, metal, or stainless steel. The shield can 420 may include a non-conductive material in addition to the conductive material.

The one or more first, second, and/or third fastening structures 430, 440, and 450 may be formed on the top surface of the circuit board 410. The one or more first, second, and/or third fastening structures 430, 440, and 450 may be formed of a conductive pad. The conductive pad may be a copper pad. Although a copper pad is used as an example of the one or more first, second, and/or third fastening structures 430, 440, and 450, embodiments of the disclosure are not limited thereto. The one or more first, second, and/or third fastening structures 430, 440, and 450 may be formed of various conductive materials.

The one or more first fastening structures 430 may be formed in various shapes corresponding to the shape and size of the shield can 420. The one or more first fastening structures 430 may have a first width A1 along a first direction L1 (e.g., the lengthwise direction), and both ends of the one or more first fastening structures 430 may be formed in a semi-circular shape. The one or more first fastening structures 430 may have a first width A1 along a second direction L2 (e.g., a direction perpendicular to the lengthwise direction) perpendicular to the first direction L1 (e.g., the lengthwise direction). The one or more second fastening structures 440 may extend from the one or more first fastening structures 430 and may have a second width A2 smaller than the first width A1. The one or more second fastening structures 440 may be formed between the one or more first fastening structures 430.

The one or more second fastening structures 440 may include at least one of a curved shape or a straight line shape. The one or more second fastening structures 440 may be shaped as a curve. At least a portion of the shield can 420 may be shaped as a curve, and the curved portion of the shield can 420 may face the one or more second fastening structures 440 shaped as a curve.

The one or more third fastening structures 450 may be formed inside the one or more first fastening structures 430 and may have a third width A3 smaller than the first width A1. The one or more third fastening structures 450 may include at least one of a curved shape or a straight line shape. The one or more third fastening structures 450 may be shaped as a straight line. At least a portion of the shield can 420 may be shaped as a straight line, and the straight portion of the one or more third fastening structures 450 may face at least a portion of the shield can 420 shaped as a straight line.

As such, the one or more second fastening structures 440 may be formed in a curved shape between the one or more first fastening structures 430, and the one or more third fastening structures 450 may be shaped as a straight line inside the one or more first fastening structures 430.

In this state, solder cream (e.g., C1 of FIG. 9) may be applied to the first, second, and/or third fastening structures 430, 440, and 450 using a soldering device. The shield can 420 may be mounted on the applied solder cream C1.

While the shield can 420 is coupled to the top surface of the circuit board 410, the bottom surface of the shield can 420 may simultaneously be rendered to face the solder cream (C1)—applied first, second, and/or third fastening structures 430, 440, and 450. For example, the shield can 420 may be mounted on the applied solder cream C1.

In this state, the solder cream C1 may be thermally treated and, in a predetermined time, the solder cream C1 may turn solid. In this case, the solid solder cream C1 solders the first, second, and/or third fastening structures 430, 440, and 450 with the shield can 420. When thermally treated at a high temperature, the solder cream C1 may be hardened while simultaneously pulling the shield can 420 by surface tension. At this time, the solder cream C1 may precisely position and solder the shield can 420 to the first, second, and/or third fastening structures 430, 440, and 450 by surface tension.

Since the second and third widths A2 and A3 of the second and third fastening structures 440 and 450 are smaller than the first width A1 of the first fastening structure 430, if the solder cream C1 is thermally treated at a high temperature, large surface tension may be caused at the second and third widths A2 and A3 than at larger widths and, thus, the shield can 420 may be precisely positioned and coupled to the centers of the first, second, and/or third fastening structures 430, 440, and 450. When the second and third widths A2 and A3 are equal to or larger than the first width A1, the shield can 420 may be soldered off the centers of the first, second, and/or third fastening structures 430, 440, and 450. Thus, the second and third widths A2 and A3 which are smaller than the first width A1 may prevent the shield can 420 from being out of place or twisted on the top surfaces of the first, second, and/or third fastening structures 430, 440, and 450, coupling the shield can 420 securely and precisely in place.

Figure 9C:
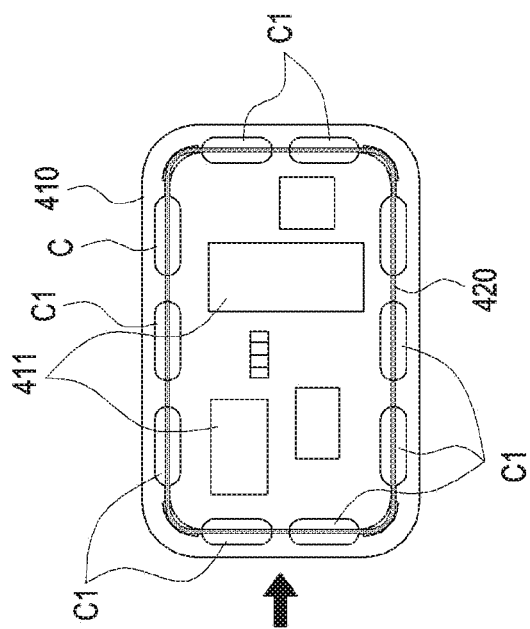
FIGS. 9A, 9B, and 9C are plan views of a process of coupling a shield can structure included in an electronic device, according to an embodiment.
Figure 9B:
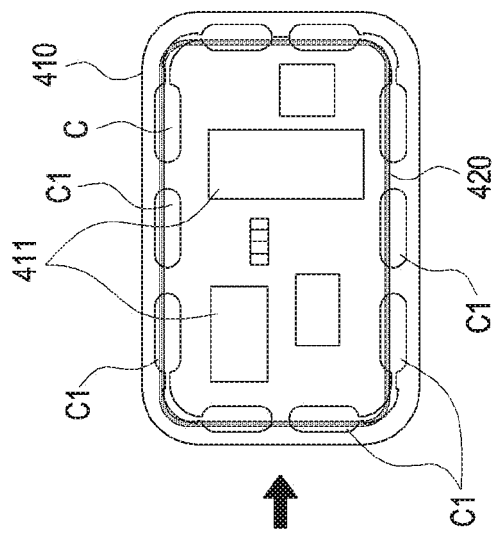
Figure 9A:
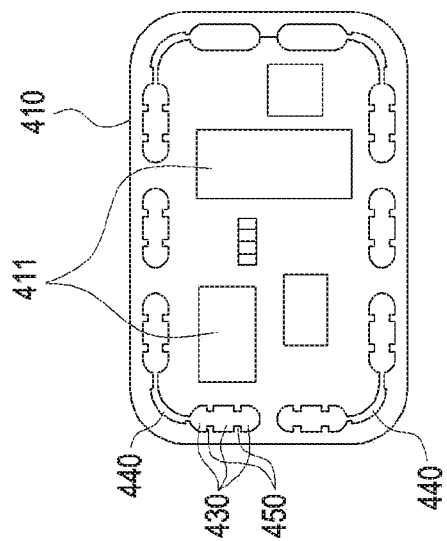

FIGS. 9A, 9B, and 9C are plan views of a process of coupling a shield can structure 400 included in an electronic device 101, according to an embodiment.

Referring to FIGS. 9A, 9B, and 9C, the shield can structure 400 included in the electronic device 101 may include a housing 310 of the electronic device 101, a circuit board 410 having one or more electronic components 411 mounted thereon, a shield can 420 covering one or more electronic components 411, a first fastening structure 430 with a first width A1, a second fastening structure 440 with a second width A2 smaller than the first width A1, and a third fastening structure 450 with a third width A3 smaller than the first width A1.

As shown in FIG. 9A, the one or more one or more first fastening structures 430 may be formed around one or more electronic components 411 mounted on the circuit board 410. The one or more first fastening structures 430 may be formed on the top surface of the circuit board 410. The one or more second fastening structures 440 may extend from the one or more first fastening structures 430 and be formed between the one or more first fastening structures 430. The one or more second fastening structures 440 may be curved. The one or more curved second fastening structures 440 may be formed between the one or more first fastening structures 430 while connecting the one or more first fastening structures 430.

The one or more third fastening structures 450 may be formed inside the one or more first fastening structures 430. The one or more third fastening structures 450 may be shaped as a straight line.

In this state, solder cream C1 may be applied to the top surfaces of the one or more first, second, and/or third fastening structures 430, 440, and 450 using a soldering device, as shown in FIG. 9B. Next, the shield can 420 may be mounted on the applied solder cream C1. At this time, the shield can 420 may be placed on top of the first, second, and/or third fastening structures 430, 440, and 450.

Simultaneously, the bottom of the shield can 420 may be brought in contact with the top surface of the solder cream C1 while the shield can 420 covers the one or more electronic components 411.

If thermal treatment is performed as shown in FIG. 9C, with the circuit board 410 and the shield can 420 coupled together, the solder cream C1 applied onto the top surfaces of the first, second, and/or third fastening structures 430, 440, and 450 may be melted, causing surface tension. The solder cream C1 may be held together, by surface tension, on the surface of the first, second, and/or third fastening structures 430, 440, and 450 while aligning the shield can 420 onto the first, second, and/or third fastening structures 430, 440, and 450. When hardened by the thermal treatment, the solder cream C1 pulls the shield can 420 by surface tension while simultaneously allowing the shield can 420 to be positioned in place on, and be soldered to, the first, second, and/or third fastening structures 430, 440, and 450.

As such, as the second and third widths A2 and A3 of the second and third fastening structures 440 and 450 are smaller than the first width A1 of the first fastening structure 430, the surface tension at the second and third widths A2 and A3 is larger than the surface tension at the first width A1 which is larger than the second and third widths A2 and A3 when the solder cream C1 is thermally treated, so that the shield can 420 may be positioned precisely in place on, and coupled to, the top surfaces of the first, second, and/or third fastening structures 430, 440, and 450. In other words, the second and third widths A2 and A3 of the second and third fastening structures 440 and 450 allow the shield can 420 to be positioned and coupled precisely to the centers of the first, second, and/or third fastening structures 430, 440, and 450. Further, it is possible to prevent interference with one or more adjacent electronic components 411 and other shield can 420 mounted on the circuit board 410.

Figure 10:
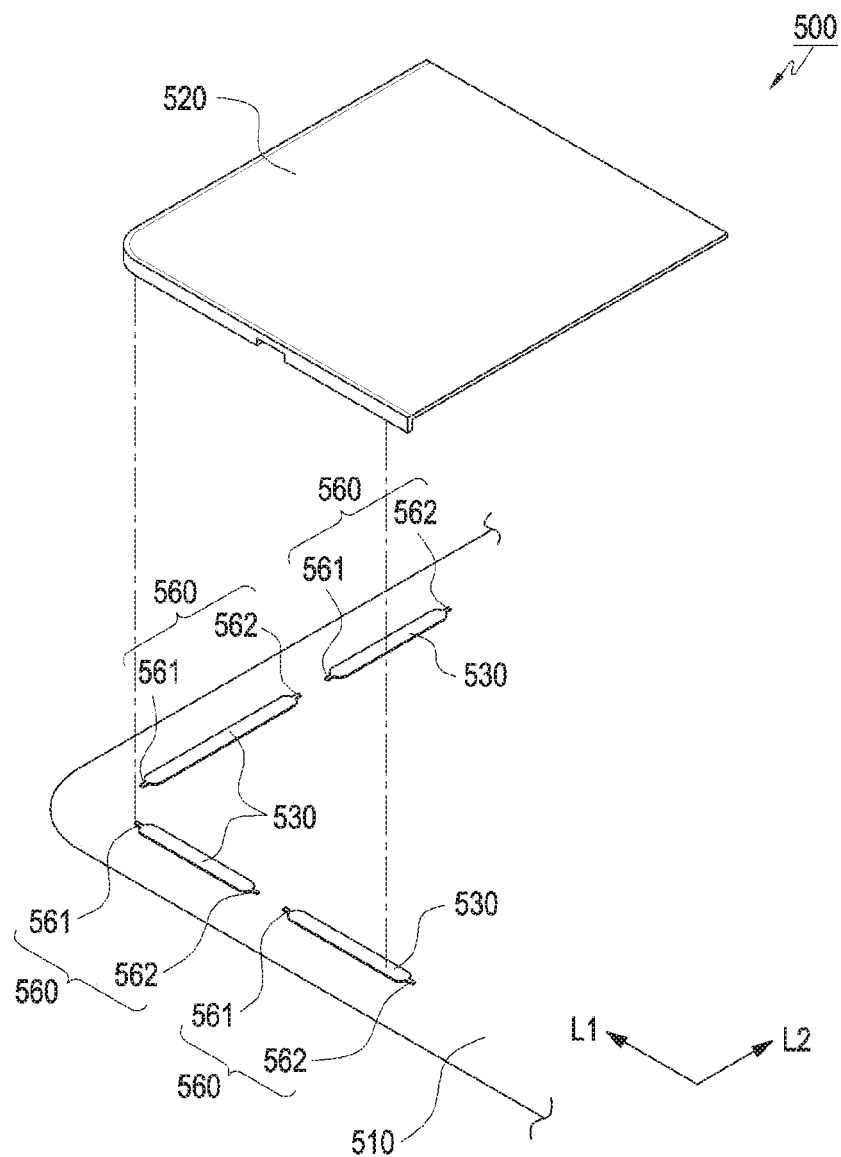
FIG. 10 is an exploded perspective view of a configuration of a shield can structure included in an electronic device, according to an embodiment.
Figure 11:
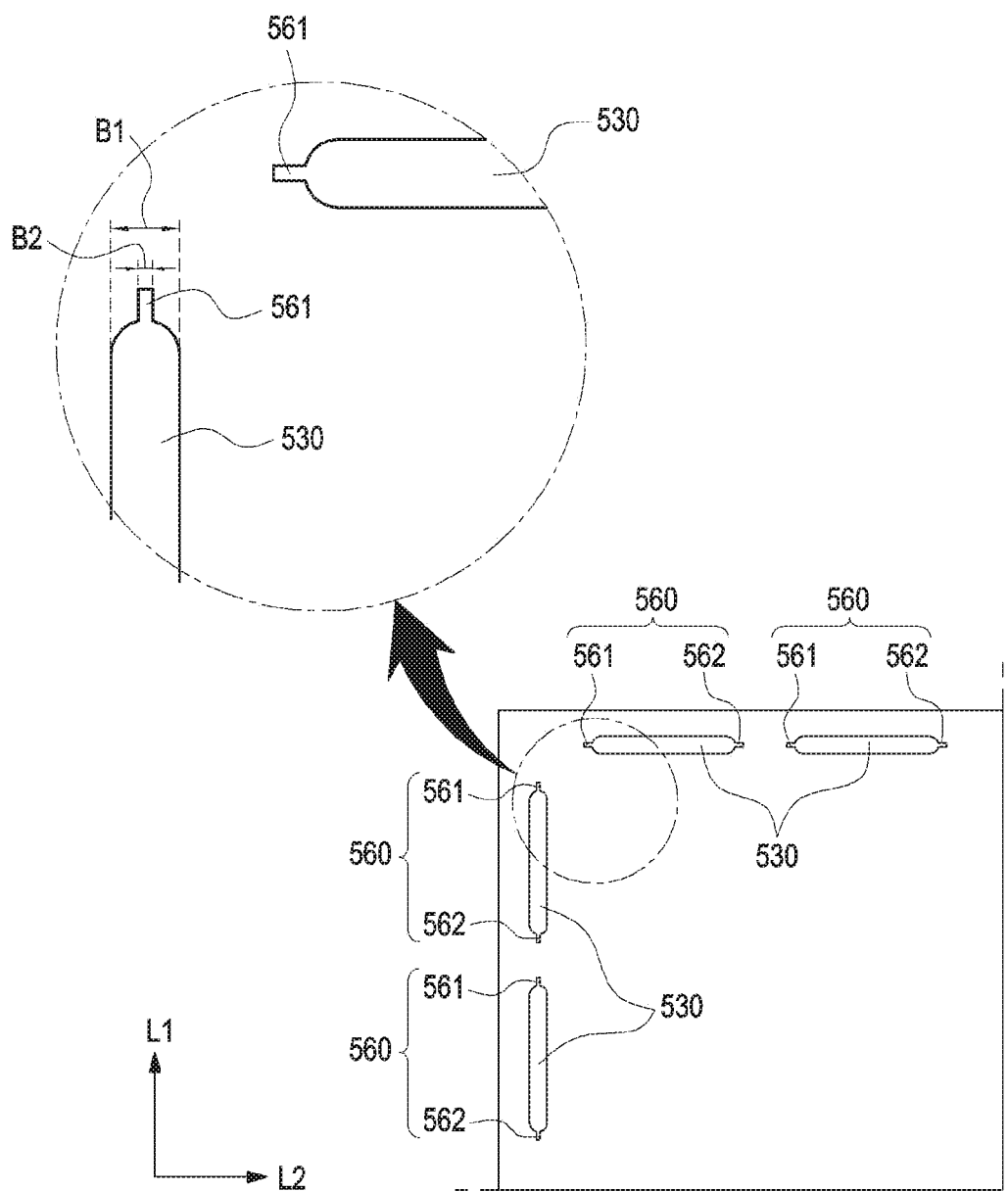
FIG. 11 is a plan view of one or more first fastening structures and one or more guide portions formed on a circuit board in a configuration of a shield can structure included in an electronic device, according to an embodiment.
Figure 12:
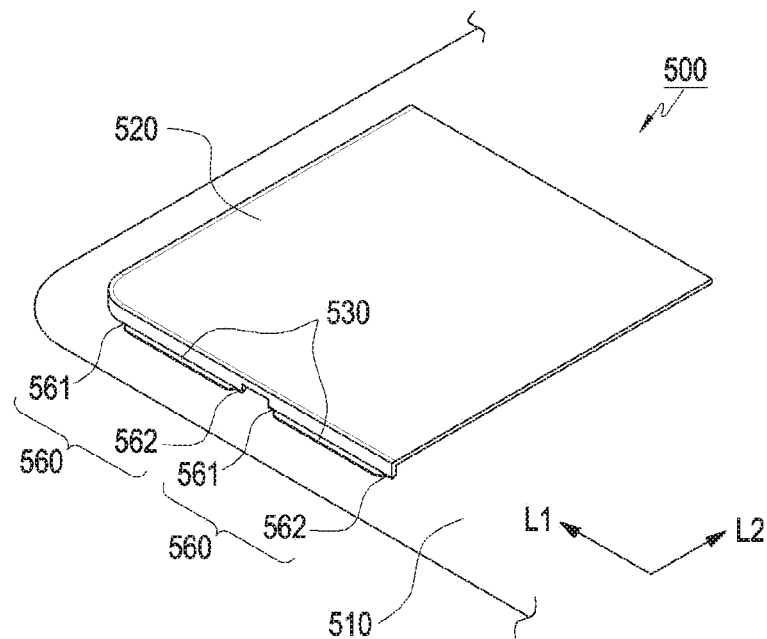
FIG. 12 is a perspective view of a coupled state of a shield can structure included in an electronic device, according to an embodiment.
Figure 13:
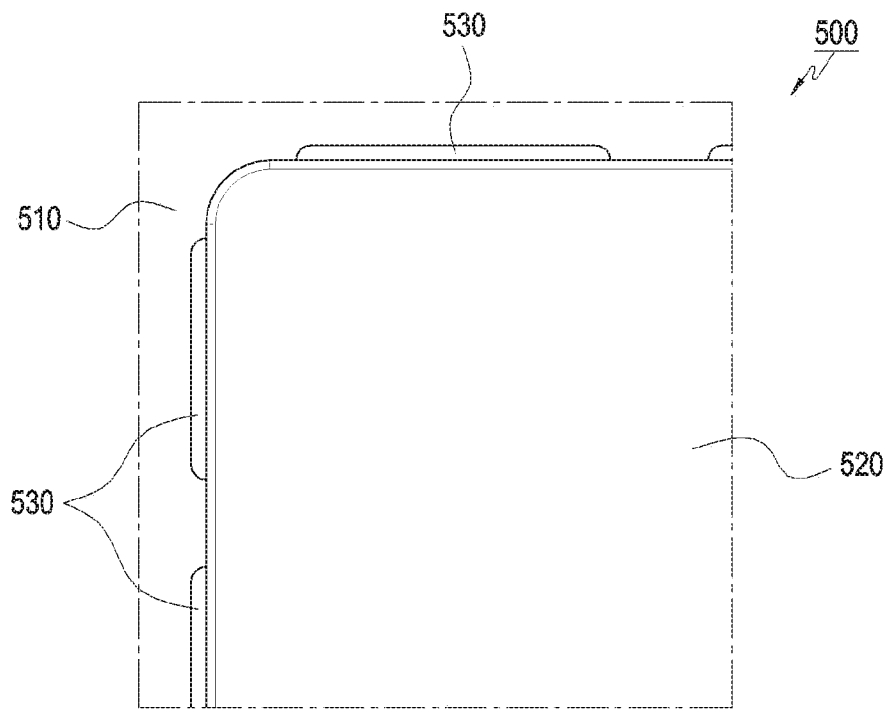
FIG. 13 is a plan view of a coupled state of a shield can structure included in an electronic device, according to an embodiment.

FIG. 10 is an exploded perspective view of a configuration of a shield can 500 structure included in an electronic device 101, according to an embodiment. FIG. 11 is a plan view of one or more first fastening structures 530 and one or more guide portions 560 formed on a circuit board 510 in a configuration of a shield can structure 500 included in an electronic device 101, according to an embodiment. FIG. 12 is a perspective view of a coupled state of a shield can structure 500 included in an electronic device 101, according to an embodiment. FIG. 13 is a plan view of a coupled state of a shield can structure 500 included in an electronic device 101, according to an embodiment.

Referring to FIGS. 10 to 13, a shield can structure 500 included in an electronic device 101 may include a housing 310 of the electronic device 101, a circuit board 510 on which one or more electronic components 411 are mounted, a shield can 520, one or more first fastening structures 530, and one or more guide portions 560. The circuit board 510 may be disposed in the housing 310 of the electronic device 101. The shield can 520 may be coupled to the circuit board 510 and, to shield EMI caused from the one or more electronic components 411, the shield can 420 may cover the one or more electronic components (e.g., the electronic component 411 of FIG. 9).

The one or more first fastening structures 530 may be formed on the top surface of the circuit board 510. The one or more first fastening structures 530 may be formed of conductive pads that may be copper pads.

The one or more first fastening structures 530 may be formed in various shapes corresponding to the shape and size of the shield can 520. The one or more first fastening structures 530 may be formed along a first direction L1 (e.g., the lengthwise direction of the one or more first fastening structures 530), and both ends of the one or more first fastening structures 530 may be formed in a semi-circular shape. The one or more first fastening structures 530 may have a first width B1 in a second direction L2 (e.g., a direction perpendicular to the lengthwise direction of the one or more first fastening structures 530) which is perpendicular to the first direction L1 (e.g., the lengthwise direction of the one or more first fastening structures 530).

The one or more guide portions 560 may be formed on the one or more first fastening structures 530 to guide coupling of the shield can 520. The one or more guide portions 560 may include a first guide portion 561 and a second guide portion 562. The first guide portion 561 may be formed to project from the center of an end of the one or more first fastening structures 530 to couple the shield can 520 to the center of the first fastening structure 530. The second guide portion 562 may be formed to project from the center of the other end of the one or more first fastening structures 530 to couple the shield can 520 to the center of the first fastening structure 530. The first and second guide portions 561 and 562 may be formed to project from the centers of both ends of the one or more first fastening structures 530 along the first direction L1.

The first and second guide portions 561 and 562 may have a guide width B2 smaller than the first width B1.

In this state, solder cream (e.g., C1 of FIG. 14) may be applied to the first fastening structure 530 and the guide portions 560 using a soldering device. The shield can 520 may be mounted on the applied solder cream C1.

At this time, the shield can 520 may be coupled onto the top surface of the circuit board 510 while the bottom surface of the shield can 520 may face the one or more first fastening structures 530 and the first and second guide portions 561 and 562. At this time, the shield can 520 may be guided and coupled by the first and second guide portions 561 and 562 projecting from both ends of the one or more first fastening structures 530. Thus, the shield can 520 may be positioned precisely to the centers of the one or more first fastening structures 530 by the first and second guide portions 561 and 562.

A thermal treatment process on the one or more first fastening structures 530 and the one or more guide portions 560 may be at least partially identical or similar in configuration to the thermal treatment process on the one or more first, second, and/or third fastening structures 430, 440, and 450 described above. Thus, thermal treatment on the one or more first fastening structures 530 and the one or more guide portions 560 may be easily appreciated from the above-described embodiments and, thus, no detailed description thereof is given.

FIGS. 14A, 14B, and 14C are plan views of a process of coupling a shield can structure 500 included in an electronic device 101, according to an embodiment.

Figure 14:
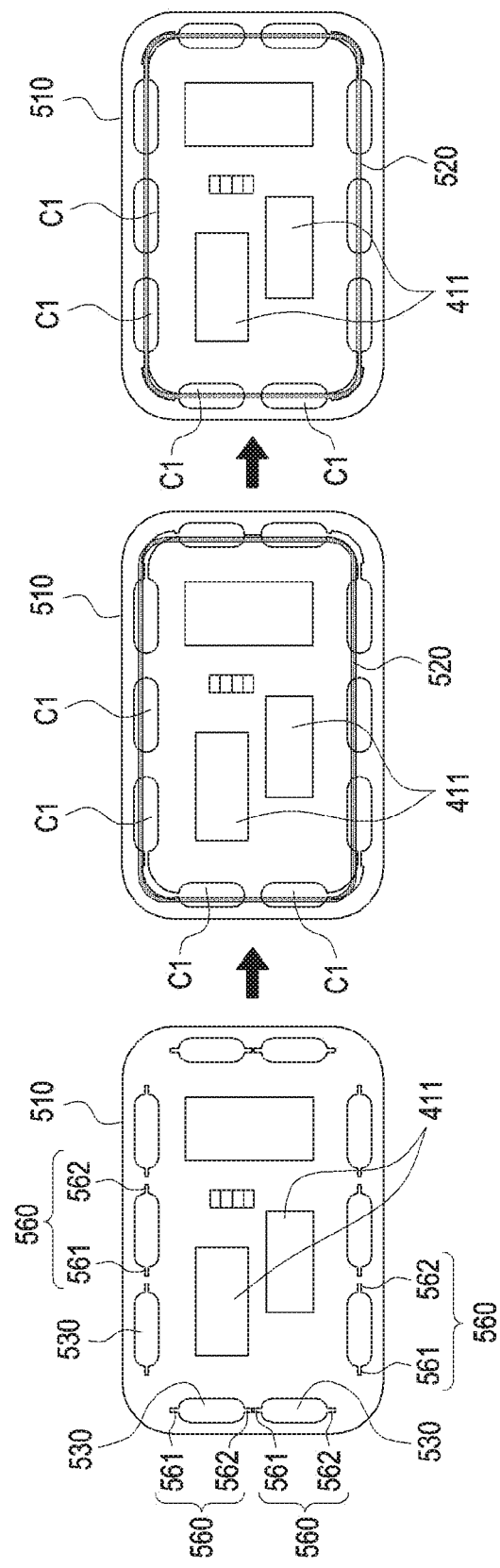
FIGS. 14A, 14B, and 14C are plan views of a process of coupling a shield can structure included in an electronic device, according to an embodiment.

Referring to FIGS. 14A, 14B, and 14C, a shield can structure 500 included in an electronic device 101 may include a housing 310 of the electronic device 101, a circuit board 510 on which one or more electronic components (e.g., the electronic component 411 of FIG. 14) are mounted, a shield can 520 covering the one or more electronic components 411, one or more first fastening structures 530, and one or more guide portions 560. The one or more guide portions 560 may include a first guide portion 561 and a second guide portion 562. The first guide portion 561 may be formed to project from the center of an end of the one or more first fastening structures 530. The second guide portion 562 may be formed to project from the center of the other end of the one or more first fastening structures 530.

As shown in FIG. 14A, the one or more first fastening structures 530 may be formed around one or more electronic components 411 mounted on the circuit board 510. The one or more first fastening structures 530 may be formed on the top surface of the circuit board 510. At this time, the first and second guide portions 561 and 562 formed to project from the centers of both ends of the first fastening structure 530 may be formed on the top surface of the circuit board 510 as are the one or more first fastening structures 530. At this time, the shield can 520 may be guided by the first and second guide portions 561 and 562 to be coupled to the centers of the one or more first fastening structures 530. Thus, the shield can 520 may be mounted, precisely positioned along the centers of the one or more first fastening structures 530 by the first and second guide portions 561 and 562.

In this state, solder cream C1 may be applied to the top surfaces of the one or more first fastening structures 530 and the one or more guide portions 560 using a soldering device, as shown in FIG. 14B. At this time, the solder cream C1 may also be applied to the first and second guide portions 561 and 562 included in the one or more guide portions 560.

Next, the shield can 520 may be mounted on the applied solder cream C1. At this time, the shield can 520 may be placed precisely on the centers of the one or more first fastening structures 530 by the one or more guide portions 560. The one or more guide portions 560 may guide the shield can 520 to be positioned precisely on the centers of the one or more first fastening structures 530. At this time, when the shield can 520 is mounted precisely on the centers of the one or more first fastening structures 530, the bottom of the shield can 520 may be brought in contact with the top surface of the solder cream C1 while the shield can 520 may simultaneously cover the one or more electronic components 411.

If thermal treatment is performed as shown in FIG. 14C, with the circuit board 510 and the shield can 520 coupled together, the solder cream C1 applied onto the top surfaces of the one or more first fastening structures 530 and the one or more guide portions 560 may be melted, causing surface tension. The solder cream C1 may be held together, by surface tension, on the surface of the first fastening structure 530 while aligning the shield can 520 onto the first fastening structure 530. When hardened by the thermal treatment, the solder cream C1 pulls the shield can 520 by surface tension while simultaneously allowing the shield can 520 to be positioned in place on, and be soldered to, the first fastening structure 530.

As such, as the guide width B2 of the first and second guide portions 561 and 562 is smaller than the first width B1 of the first fastening structure 530, the surface tension at the guide width B2 is larger than the surface tension at the first width B1 which is larger than the guide width B2 when the solder cream C1 is thermally treated, so that the shield can 520 may be positioned precisely in place on, and coupled to, the top surface of the first fastening structure 530. Thus, the first and second guide portions 561 and 562 may allow soldering to be performed, with the shield can 520 precisely positioned to the center of the first fastening structure 530. Thus, it is possible to prevent interference with one or more adjacent electronic components 411 and other shield can 520 mounted on the circuit board 510.

Figure 15:
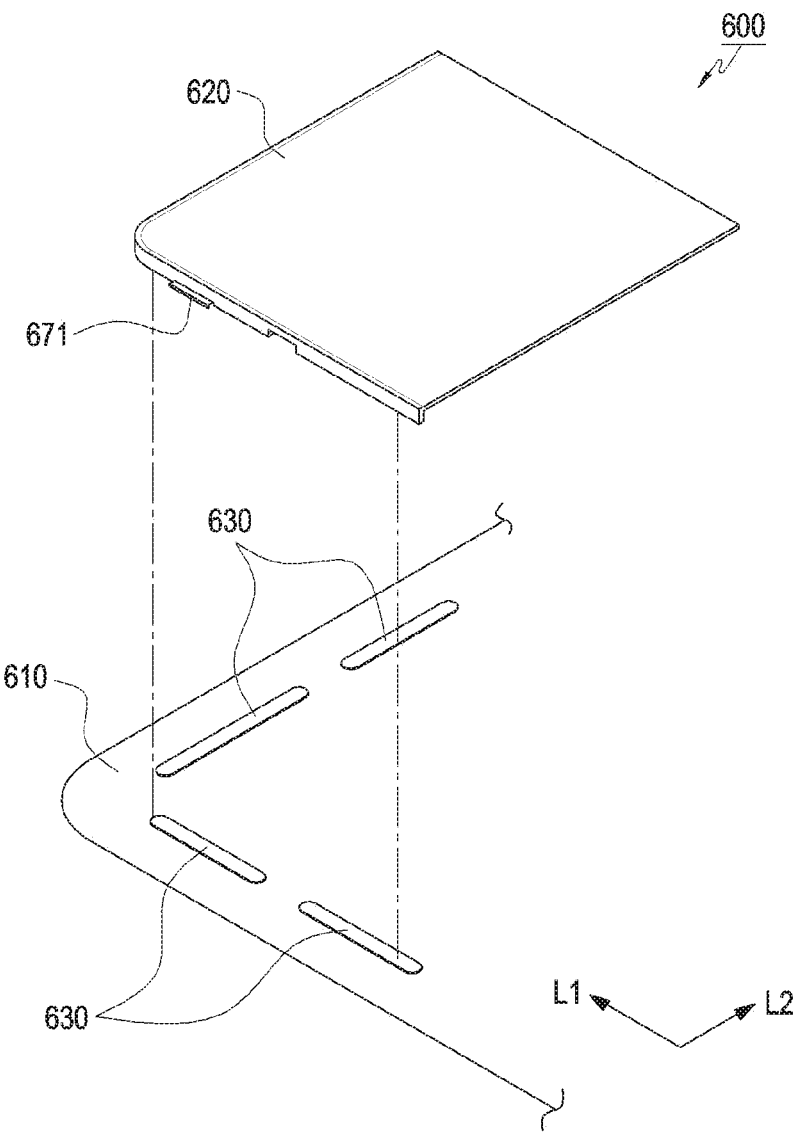
FIG. 15 is an exploded perspective view of a configuration of a shield can structure included in an electronic device, according to an embodiment.
Figure 16:
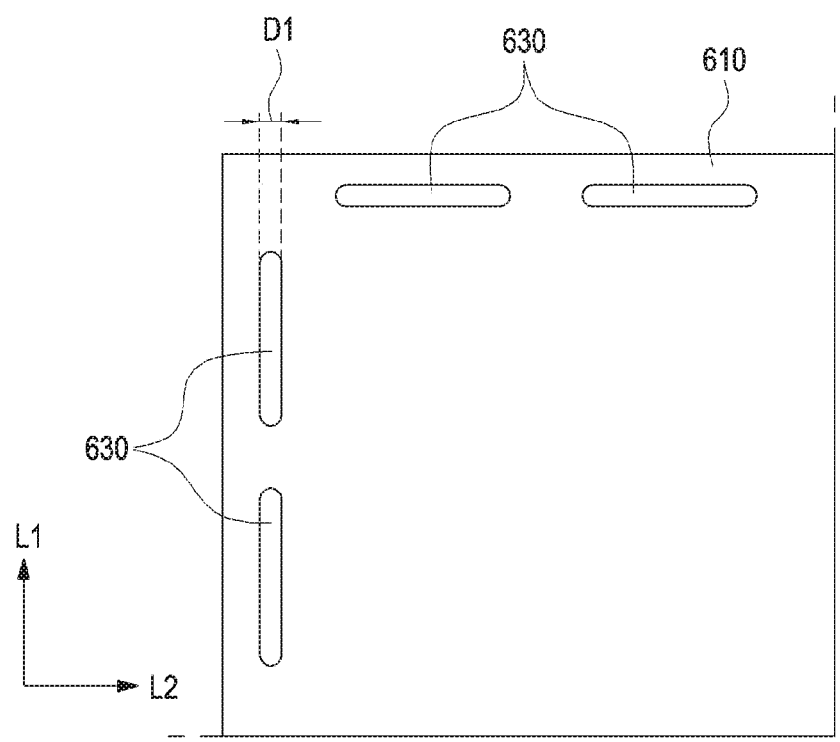
FIG. 16 is a plan view of one or more first fastening structures formed on a circuit board in a configuration of a shield can structure included in an electronic device, according to an embodiment.
Figure 17:
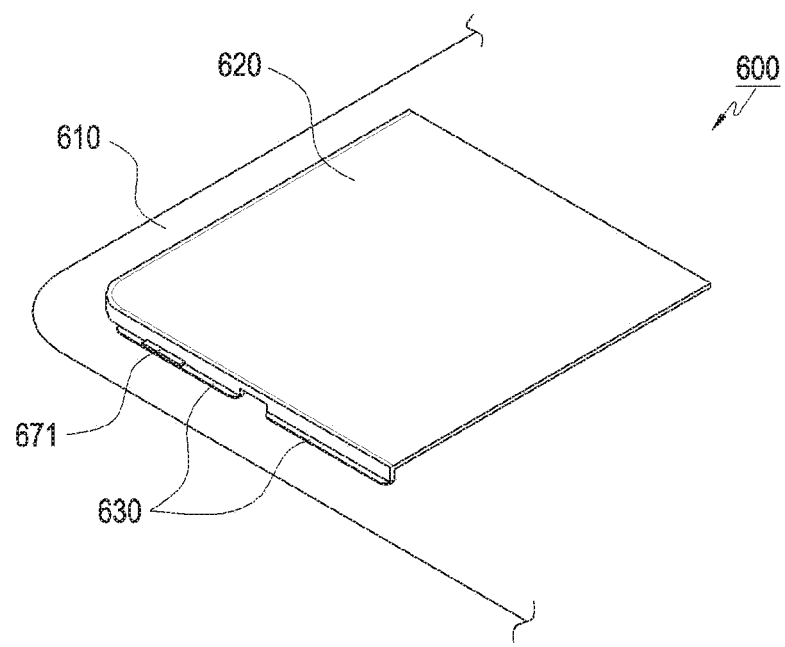
FIG. 17 is a perspective view of a coupled state of a shield can structure included in an electronic device, according to an embodiment.
Figure 18:
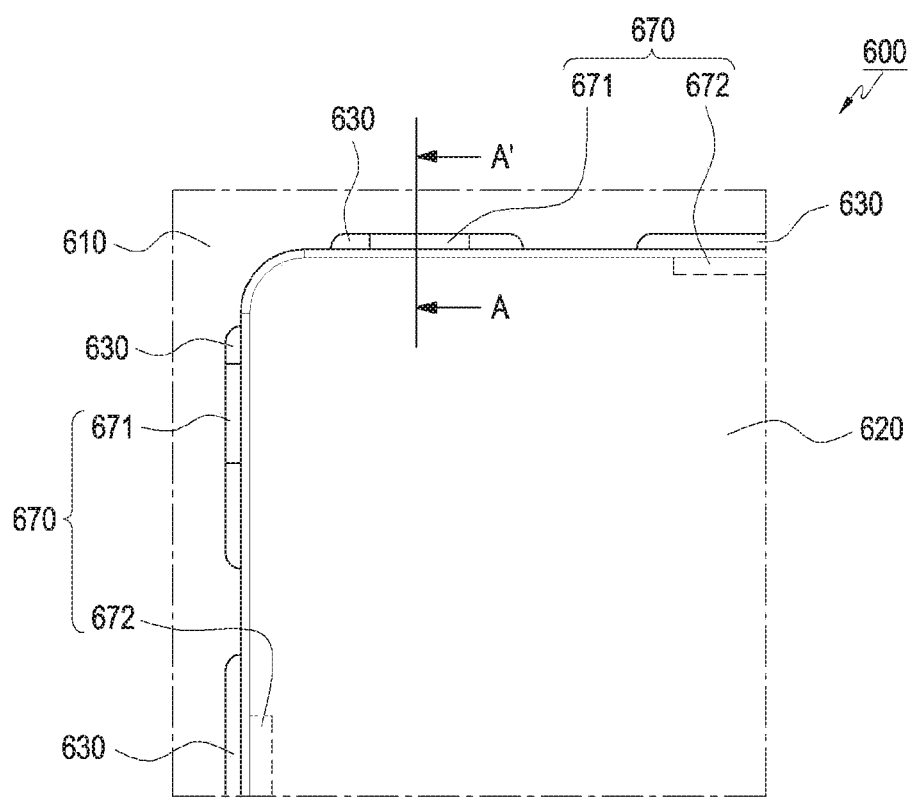
FIG. 18 is a plan view of a coupled state of a shield can structure included in an electronic device, according to an embodiment.
Figure 19:
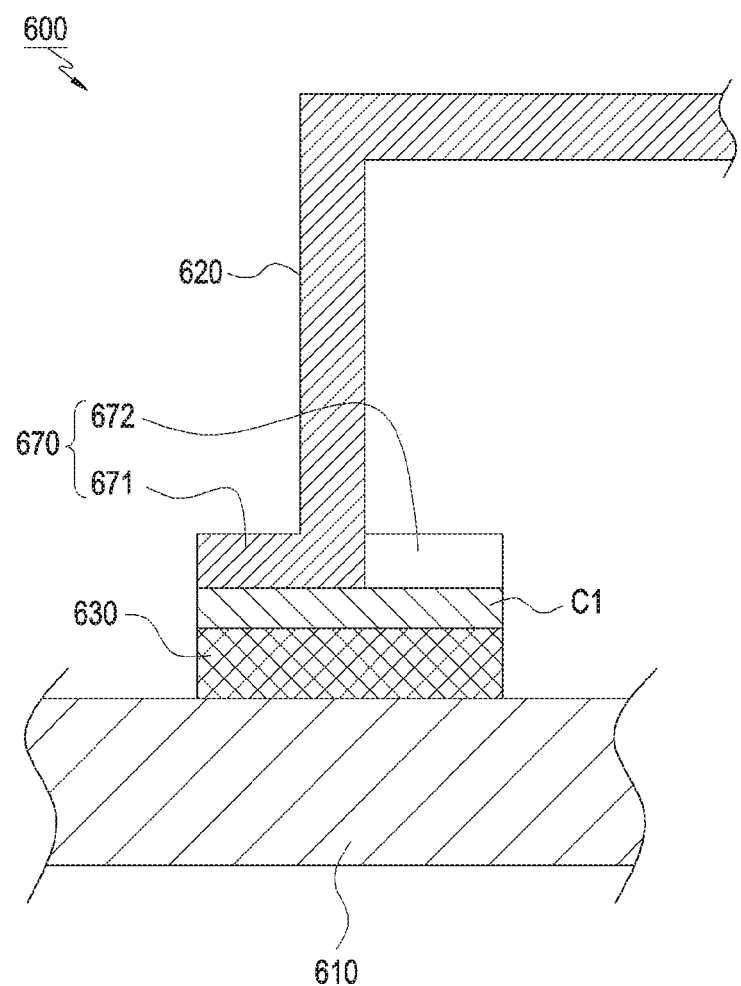
FIG. 19 is a cross-sectional view taken along line A-A' of FIG. 18, according to an embodiment.

FIG. 15 is an exploded perspective view of a configuration of a shield can structure 600 included in an electronic device 101, according to an embodiment. FIG. 16 is a plan view of one or more first fastening structures 630 formed on a circuit board 610 in a configuration of a shield can structure 600 included in an electronic device 101, according to an embodiment. FIG. 17 is a perspective view of a coupled state of a shield can structure 600 included in an electronic device 101, according to an embodiment. FIG. 18 is a diagram of a coupled state of a shield can structure 600 included in an electronic device 101, according to an embodiment. FIG. 19 is a cross-sectional view taken along line A-A' of FIG. 18, illustrating a coupled state of one or more coupling portions 670 and one or more first fastening structures 630 in a configuration of a shield can structure 600, according to an embodiment.

Referring to FIGS. 15 to 19, a shield can structure 600 included in an electronic device 101 may include a housing 310 of the electronic device 101, a circuit board 610 on which one or more electronic components 411 are mounted, a shield can 620, one or more first fastening structures 630, and one or more coupling portions 670. The circuit board 610 may be disposed inside the housing of the electronic device. The shield can 620 may be coupled to the circuit board 610 and, to shield EMI caused from the one or more electronic components 411, the shield can 420 may cover the one or more electronic components 411.

The one or more first fastening structures 630 may be formed in various shapes corresponding to the shape and size of the shield can 620. The one or more first fastening structures 630 may be formed along a first direction L1 (e.g., the lengthwise direction of the one or more first fastening structures 630), and both ends of the one or more first fastening structures 630 may be formed in a semi-circular shape. The one or more first fastening structures 630 may have a first width D1 in a second direction L2 (e.g., a direction perpendicular to the lengthwise direction of the one or more first fastening structures 630) which is perpendicular to the first direction L1 (e.g., the lengthwise direction of the one or more first fastening structures 630).

The shield can 620 may have the one or more coupling portions 670 that couple to the one or more first fastening structures 630. The one or more coupling portions 670 may include a first coupling portion 671 and a second coupling portion 672. The first coupling portion 671 may be externally bent from a side bottom of the shield can 620 to be coupled to at least some surface of the one or more first fastening structures 630. The second coupling portion 672 may be internally bent from a side bottom of the shield can 620 to be coupled to at least some surface of the one or more first fastening structures 630.

The first and second coupling portions 671 and 672 may be arranged in opposite directions on the side bottom of the shield can 620. The first and second coupling portions 671 and 672 may be formed alternately in the external and internal directions on the side bottom of the shield can 620. The first and second coupling portions 671 and 672 may be formed in an L shape. The first and second coupling portions 671 and 672 may be formed in a shape other than the L shape.

In this state, solder cream C1 may be applied to the first fastening structure 630 using a soldering device. The shield can 620 may be mounted on the applied solder cream C1.

At this time, the shield can 620 may be coupled onto the top surface of the circuit board 610 while the first and second coupling portions 671 and 672 formed on the bottom of the shield can 620 may face the top surface of the one or more first fastening structures 630 and be placed on the solder cream C1.

A thermal treatment process on the one or more first fastening structures 630 and the first and second coupling portions 671 and 672 may be at least partially identical or similar in configuration to the thermal treatment process on the one or more first fastening structures 430 described above. Thus, thermal treatment on the one or more first fastening structures 630 and the first and second coupling portions 671 and 672 may be easily appreciated from the above-described embodiments and, thus, no detailed description thereof is given.

FIGS. 20A, 20B, and 20C are plan views of a process of coupling a shield can structure 600 included in an electronic device 101, according to an embodiment.

Referring to FIGS. 20A, 20B, and 20C, a shield can structure 600 included in an electronic device 101 may include a housing 310 of the electronic device, a circuit board 610 on which one or more electronic components 411 are mounted, a shield can 620 covering the one or more electronic components 411, one or more first fastening structures 630, and one or more coupling portions 670. The one or more coupling portions 670 may include a first coupling portion 671 and a second coupling portion 672.

As shown in FIG. 20A, the one or more one or more first fastening structures 630 may be formed around one or more electronic components 411 mounted on the circuit board 610. The one or more first fastening structures 630 may be formed on the top surface of the circuit board 610.

In this state, solder cream C1 may be applied to the top surfaces of the one or more first fastening structures 630 using a soldering device, as shown in FIG. 20B.

Next, the shield can 620 may be mounted on the applied solder cream C1. At this time, the first coupling portion 671 of the shield can 620 may be coupled to at least some surface of the one or more first fastening structures 630, and the second coupling portion 672 of the shield can 620 may be coupled to at least some surface of the one or more first fastening structures 630. For example, when the shield can 620 is mounted on the solder cream C1, the first coupling portion 671 of the shield can 620 may be coupled to the solder cream C1 applied to at least some surface of the one or more first fastening structures 630, and the second coupling portion 672 of the shield can 620 may be coupled to the solder cream C1 applied to at least some surface of the one or more first fastening structures 630. Simultaneously, the shield can 620 may cover the one or more electronic components 411.

If thermal treatment is performed as shown in FIG. 20C, with the circuit board 610 and the shield can 620 coupled together, the solder cream C1 applied onto at least some surface of the one or more first fastening structures 630 may be melted, causing surface tension. The solder cream C1 may be held together, by surface tension, on the surface of the first fastening structure 630 while aligning the first and second coupling portions 671 and 672 of the shield can 620 onto the first fastening structure 630. When hardened by the thermal treatment, the solder cream C1 pulls the shield can 620 by surface tension while simultaneously allowing the first and second coupling portions 671 and 672 of the shield can 620 to be positioned in place on, and be soldered to, the first fastening structure 630.

As such, the first and second coupling portions 671 and 672 of the shield can 620 may be bent externally or internally on the side bottom of the shield can 620 and be coupled to at least some surface of the top of the one or more first fastening structures 630 to which the solder cream C1 has been applied. Thus, when the solder cream C1 is thermally treated, the first and second coupling portions 671 and 672 may be soldered and coupled to at least some surface of the top of the one or more first fastening structures 630 by the surface tension of the solder cream C1. Thus, the first and second coupling portions 671 and 672 of the shield can 620 may add a coupling force on the top surface of the first fastening structure 630 and prevent the shield can 620 from being misaligned or displaced from the one or more first fastening structures 630. Thus, it is possible to prevent interference with one or more adjacent electronic components 411 and other shield can 620 mounted on the circuit board 610.

According to an embodiment, an electronic device including a shield can structure includes a housing, a circuit board disposed in the housing and having one or more electronic components mounted thereon, a shield can coupled to the circuit board and covering the one or more electronic components, one or more first fastening structures formed on the circuit board and coupled to the shield can, the one or more first fastening structures having a first width, and one or more second fastening structures extending from the one or more first fastening structures, the one or more second fastening structures having a second width smaller than the first width.

The one or more second fastening structures may include at least one of a curved shape or a straight line shape.

The one or more first fastening structures may further include one or more guide portions guiding the coupling of the shield can.

The one or more guide portions may include a first guide portion and a second guide portion. The first guide portion may project from a center of an end of the one or more first fastening structures, and the second guide portion may project from a center of another end of the one or more first fastening structures.

The first and second guide portions may have a guide width smaller than the first width.

The one or more first and second fastening structures may be formed of conductive pads which may be copper pads.

The one or more first fastening structures may include one or more third fastening structures individually formed inside the one or more first fastening structures and having a third width smaller than the first width.

According to an embodiment, an electronic device including a shield can structure includes a housing, a circuit board disposed in the housing, one or more electronic components mounted on the circuit board, a shield can coupled to the circuit board and covering the one or more electronic components, and one or more first fastening structures formed on the circuit board and coupled to the shield can, the one or more first fastening structures having a first width. The shield can includes one or more coupling portions coupled to the one or more first fastening structures.

The one or more coupling portions may include a first coupling portion and a second coupling portion. The first coupling portion may be externally bent from a side bottom of the shield can, and the second coupling portion may be internally bent from the side bottom of the shield can.

The first and second coupling portions may be arranged in opposite directions on the side bottom of the shield can.

According to an embodiment, a shield can structure includes a circuit board having one or more electronic components mounted thereon, a shield can coupled to the circuit board and covering the one or more electronic components, one or more first fastening structures formed on the circuit board and coupled to the shield can, the one or more first fastening structures having a first width, and one or more second fastening structures extending from the one or more first fastening structures, the one or more second fastening structures having a second width smaller than the first width.

According to an embodiment, a shield can structure includes a circuit board having one or more electronic components mounted on thereon, a shield can coupled to the circuit board and covering the one or more electronic components, and one or more first fastening structures formed on the circuit board and coupled to the shield can, the one or more first fastening structures having a first width. The shield can includes one or more coupling portions coupled to the one or more first fastening structures.

As is apparent from the foregoing description, one or more first, second, and/or third fastening structures with a first, second, and/or third width are formed. The second and third widths of the second and third fastening structures are smaller than the first width of the first fastening structure, so that upon thermal treatment using solder cream, larger surface tension is caused at the second and third widths than at the first width larger than the second and third widths. Thus, the shield can may be mounted without misalignment or displacement on the top surface of the first, second, and/or third fastening structure. Thus, the shield can may be precisely positioned and soldered to the center of the first, second, and/or third fastening structure. Thus, the shield can may be securely and precisely mounted on the top surface of the first, second, and/or third fastening structure. It is also possible to reduce coupling deviation from one or more adjacent electronic components and other shield cans and to prevent interference between electronic components.

Further, one or more guide portions are formed to precisely position the shield can on the one or more first fastening structures formed on the circuit board. The one or more guide portions allow the shield can to be precisely mounted on the first fastening structures.

The shield can has one or more coupling portions bent externally or internally from the side bottom of the shield can. The shield can may be coupled to the one or more first fastening structures formed on the circuit board using the one or more coupling portions. Thus, the circuit board and the shield can may be coupled more securely or firmly. It is also possible to prevent the shield can from being misaligned or displaced from the one or more first fastening structures.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device, comprising:
   a housing;
   a circuit board disposed in the housing and one or more electronic components mounted on the circuit board;
   a shield can coupled to the circuit board and covering the one or more electronic components;
   one or more first conductive pads disposed on the circuit board and coupled to the shield can, the one or more first conductive pads having a first width; and
   one or more second conductive pads extending from the one or more first conductive pads, the one or more second conductive pads having a second width smaller than the first width,
   wherein a solder cream is applied to upper surfaces of the one or more first conductive pads and the one or more second conductive pads, and the shield can is disposed on the applied solder cream.

2. The electronic device of claim 1, wherein the one or more second conductive pads include at least one of a curved shape or a straight line shape.

3. The electronic device of claim 1, wherein the one or more first conductive pads further include one or more guide portions guiding the coupling of the shield can.

4. The electronic device of claim 3, wherein the one or more guide portions include a first guide portion and a second guide portion, wherein the first guide portion projects from a center of an end of the one or more first conductive pads, and wherein the second guide portion projects from a center of another end of the one or more first conductive pads.

5. The electronic device of claim 4, wherein the first and second guide portions have a guide width smaller than the first width.

6. The electronic device of claim 1, wherein the one or more first and second conductive pads are copper pads.

7. The electronic device of claim 1, wherein the one or more first conductive pads include one or more third conductive pads individually formed inside the one or more first conductive pads and having a third width smaller than the first width.

8. An electronic device, comprising:
a housing;
a circuit board disposed in the housing and one or more electronic components mounted on the circuit board;
a shield can coupled to the circuit board and covering the one or more electronic components; and
one or more first conductive pads disposed on the circuit board and coupled to the shield can, the one or more first conductive pads having a first width,
wherein the shield can includes one or more coupling portions coupled to the one or more first conductive pads,
wherein the one or more coupling portions include a first coupling portion and a second coupling portion,
wherein the first coupling portion is externally bent from a side bottom of the shield can, and
wherein the second coupling portion is internally bent from the side bottom of the shield can.

9. The electronic device of claim 8, wherein the first and second coupling portions are arranged in opposite directions on the side bottom of the shield can.

10. A shield can structure, comprising:
a circuit board on which one or more electronic components are mounted;
a shield can coupled to the circuit board and covering the one or more electronic components;
one or more first conductive pads disposed on the circuit board and coupled to the shield can, the one or more first conductive pads having a first width; and
one or more second conductive pads extending from the one or more first conductive pads, the one or more second conductive pads having a second width smaller than the first width,
wherein a solder cream is applied to upper surfaces of the one or more first conductive pads and the one or more second conductive pads, and the shield can is disposed on the applied solder cream.

11. The shield can structure of claim 10, wherein the one or more second conductive pads include at least one of a curved shape or a straight line shape.

12. The shield can structure of claim 10, wherein the one or more first conductive pads further include one or more guide portions guiding the coupling of the shield can.

13. The shield can structure of claim 12, wherein the one or more guide portions include a first guide portion and a second guide portion, wherein the first guide portion projects from a center of an end of the one or more first conductive pads, and wherein the second guide portion projects from a center of another end of the one or more first conductive pads.

14. The shield can structure of claim 13, wherein the first and second guide portions have a guide width smaller than the first width.

15. The shield can structure of claim 10, wherein the one or more first and second conductive pads are copper pads.

16. The shield can structure of claim 10, wherein the one or more first conductive pads include one or more third conductive pads individually formed inside the one or more first conductive pads and having a third width smaller than the first width.

* * * * *